(12) United States Patent
Guo

(10) Patent No.: US 12,015,225 B2
(45) Date of Patent: Jun. 18, 2024

(54) CONNECTOR

(71) Applicant: VIVO MOBILE COMMUNICATION CO., LTD., Guangdong (CN)

(72) Inventor: Chao Guo, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 260 days.

(21) Appl. No.: 17/545,869

(22) Filed: Dec. 8, 2021

(65) Prior Publication Data

US 2022/0102922 A1 Mar. 31, 2022

Related U.S. Application Data

(63) Continuation of application No. PCT/CN2020/095539, filed on Jun. 11, 2020.

(30) Foreign Application Priority Data

Jun. 18, 2019 (CN) .......................... 201910527593.X

(51) Int. Cl.
 *H01R 13/703* (2006.01)
 *H01R 13/713* (2006.01)
 *H02H 3/08* (2006.01)
(52) U.S. Cl.
 CPC ..... *H01R 13/7137* (2013.01); *H01R 13/7036* (2013.01); *H02H 3/085* (2013.01)
(58) Field of Classification Search
 CPC ........................... H01R 13/6683; H01R 13/70; H01R 13/7036; H01R 13/7137; H01R 13/703;

(Continued)

(56) References Cited

U.S. PATENT DOCUMENTS 6,648,661 B1 11/2003 Byrne et al.
2005/0141208 A1* 6/2005 Niinuma ............... G06F 1/266
361/797

(Continued)

FOREIGN PATENT DOCUMENTS

CN 103050851 A 4/2013
CN 103580461 A 2/2014

(Continued)

OTHER PUBLICATIONS

International Search Report and Written Opinion of International Application No. PCT/CN2020/095539 mailed on Sep. 15, 2020.

(Continued)

*Primary Examiner* — Timothy J Thompson
*Assistant Examiner* — Guillermo J Egoavil
(74) *Attorney, Agent, or Firm* — IP & T GROUP LLP

(57) ABSTRACT

A connector has a first end provided with a first interface and a second end provided with a second interface. The second interface includes a first switch unit and a second switch unit, where the second switch unit is connected to a control terminal of the first switch unit and a ground pin of the second interface, and a preset reference voltage is input into the ground pin of the second interface. In a case that the second interface is disconnected from a to-be-charged device, the first switch unit is in an off state. In a case that the second interface is connected to the to-be-charged device, the ground pin of the second interface is connected to a ground pin of the to-be-charged device, the ground pin of the second interface is grounded, and the first switch unit is in an on state.

12 Claims, 2 Drawing Sheets

(58) Field of Classification Search
CPC ......................... H01R 13/713; H01R 2201/06; H01R 31/065; H02H 3/085; H02J 2207/30; H03K 17/0822; H03K 2217/0054
USPC ........................................................ 361/103
See application file for complete search history.

(56) References Cited

U.S. PATENT DOCUMENTS

| | | |
|---|---|---|
| 2013/0092514 A1 | 4/2013 | Chen et al. |
| 2013/0103878 A1 | 4/2013 | Ho et al. |
| 2014/0042830 A1 | 2/2014 | Lv et al. |
| 2016/0274650 A1 | 9/2016 | Deng et al. |

FOREIGN PATENT DOCUMENTS

| | | |
|---|---|---|
| CN | 106033240 A | 10/2016 |
| CN | 108233130 A | 6/2018 |
| CN | 108282010 A | 7/2018 |
| CN | 108998293 A | 12/2018 |
| CN | 110277700 A | 9/2019 |
| JP | 2016-39690 A | 3/2016 |

OTHER PUBLICATIONS

First Office Action of Priority Application No. 201910527593.X mailed on May 9, 2020.

* cited by examiner

| | A12 | A11 | A10 | A9 | A8 | A7 | A6 | A5 | A4 | A3 | A2 | A1 |
|---|---|---|---|---|---|---|---|---|---|---|---|---|
| | CTL | RX2+ | RX2- | VBUS | SBU1 | D+ | D- | CC | VBUS | TX1- | TX1+ | GND |
| | GND | TX2+ | TX2- | VBUS | Vconn | | | SUB2 | VBUS | RX1- | RX1+ | GND |
| | B1 | B2 | B3 | B4 | B5 | B6 | B7 | B8 | B9 | B10 | B11 | B12 |

FIG. 3

CONNECTOR

CROSS-REFERENCE TO RELATED APPLICATIONS

This application is a Bypass Continuation Application of PCT/CN2020/095539 filed on Jun. 11, 2020, which claims priority to Chinese Patent Application No. 201910527593.X filed on Jun. 18, 2019, which are incorporated herein by reference in their entirety.

TECHNICAL FIELD

The present disclosure relates to the technical field of communication applications, and in particular, to a connector.

BACKGROUND

With development of large-current fast-charging technologies, most iron shells of sockets of universal serial bus (USB) interfaces are grounded. For a Type-C socket, on one hand, grounding can reduce charging interference and interference during data transmission, especially USB3.0 communication, during which signal interference is very serious, and three-dimensional shielding measures are required for transmitting TX or receiving RX; and on the other hand, grounding can enable a shield layer and a weaving network to form a loop, so that part of return current during charging is shared, which is conducive to making data cables thinner.

In normal cases, because terminals of a data cable are electrified for a long time and exposed to an environment, power pins are corroded in an environment with relatively high humidity, which causes foreign matters to adhere to pin terminals and increases contact impedance, thereby affecting charging by a user, and resulting in poor user experience.

SUMMARY

A connector, where a first end of the connector is provided with a first interface, a second end of the connector is provided with a second interface, the first interface is connected to a charging power supply, and the second interface includes:
  a first switch unit, where the first switch unit is connected in series between a power input terminal and a power output terminal of the second interface; and
  a second switch unit, where the second switch unit is connected to a control terminal of the first switch unit and a ground pin of the second interface, and a preset reference voltage is input into the ground pin of the second interface, where
  in a case that the second interface is disconnected from a to-be-charged device, the first switch unit is in an off state; and in a case that the second interface is connected to the to-be-charged device, the ground pin of the second interface is connected to a ground pin of the to-be-charged device, the ground pin of the second interface is grounded, and the first switch unit is in an on state.

BRIEF DESCRIPTION OF DRAWINGS

To describe the technical solutions in embodiments of the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings.

FIG. 3 is a schematic diagram of an arrangement sequence of pins of a plug of a Type-C interface according to an embodiment of the present disclosure.

DESCRIPTION OF EMBODIMENTS

The technical solutions in the embodiments of the present disclosure are described below clearly with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure shall fall within the protection scope of the present disclosure.

Figure 1:
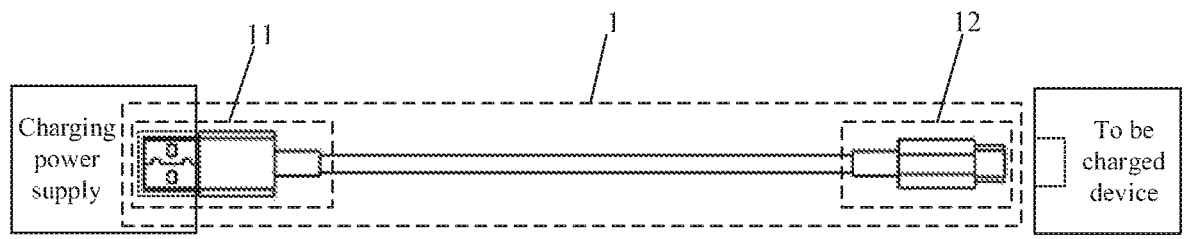
FIG. 1 is a schematic structural diagram of a connector according to an embodiment of the present disclosure.
Figure 2:
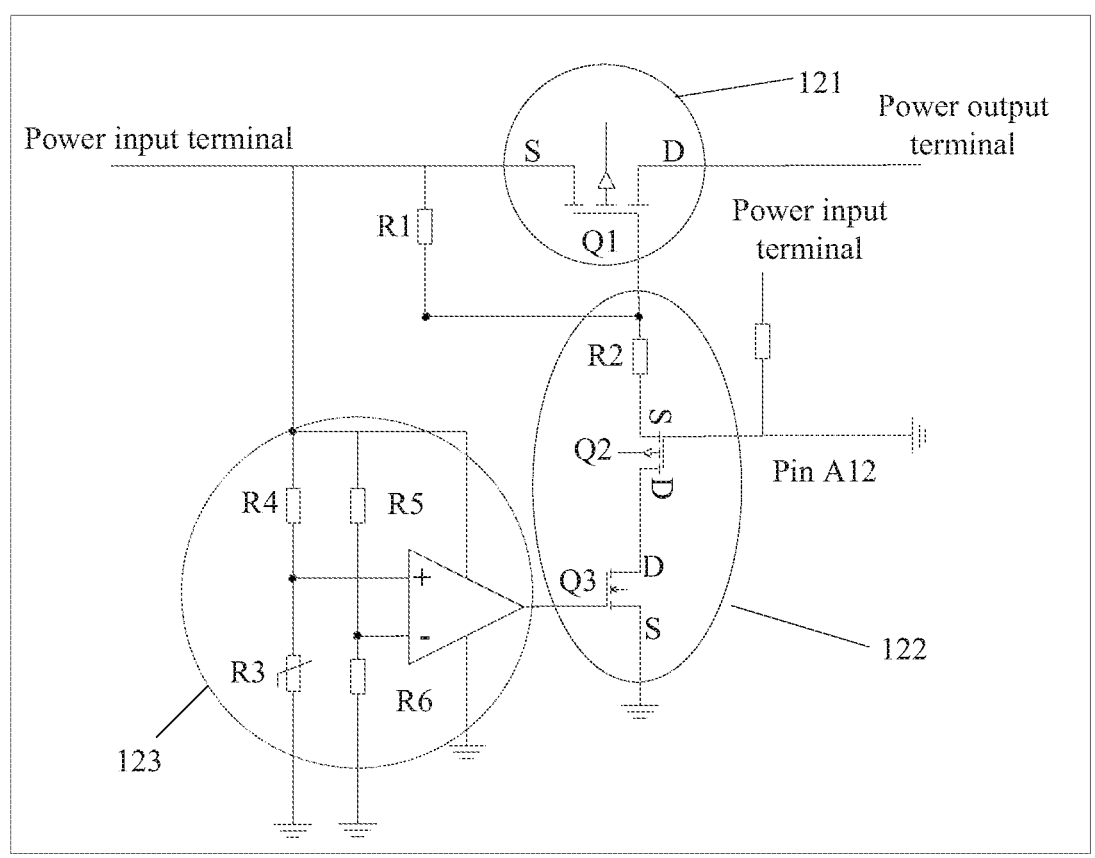
FIG. 2 is a schematic diagram of a circuit of a second interface according to an embodiment of the present disclosure.

An embodiment of the present disclosure provides a connector. The connector may be a charging cable and/or a data cable. As shown in FIG. 1, a first end of the connector 1 is provided with a first interface 11, a second end of the connector 1 is provided with a second interface 12, and the first interface 11 is connected to a charging power supply. As shown in FIG. 2, the second interface 12 includes:
  a first switch unit 121, where the first switch unit 121 is connected in series between a power input terminal VBUS_IN and a power output terminal VBUS_OUT of the second interface 12; and
  a second switch unit 122, where the second switch unit 122 is connected to a control terminal of the first switch unit 121 and a ground pin A12 of the second interface, and a preset reference voltage is input into the ground pin of the second interface, for example, as shown in FIG. 1, the ground pin of the second interface is connected to the power input terminal.

In a case that the second interface is disconnected from a to-be-charged device, the second switch unit 122 is in an off state, so that the first switch unit 121 is in the off state; and in a case that the second interface is connected to the to-be-charged device, the ground pin of the second interface is connected to a ground pin of the to-be-charged device, the ground pin of the second interface is grounded, and the first switch unit 121 is in an on state.

The connector may be a Type-C data cable. The ground pin of the second interface may be a ground pin, for example, a pin A12, in a port C of the Type-C data cable. Certainly, the ground pin may alternatively be another ground pin in the port C. FIG. 3 shows an arrangement sequence of pins of a plug of a Type-C interface, where an original ground pin A12 is used as a control CTL pin.

The first switch unit may be a metal-oxide-semiconductor field-effect transistor (MOSFET). The ground pin is connected to a gate of the MOSFET, that is, the ground pin is used as a control pin of the MOSFET. The first switch unit is controlled by the second switch unit, so that in a case that the data cable is not connected to a to-be-charged device, the port C of the data cable is in a de-energized state, thereby reducing terminal corrosion.

According to the connector in this embodiment of the present disclosure, the first switch unit is connected in series between the power input terminal and the power output terminal of the second interface, the second switch unit is connected to the control terminal of the first switch unit and the ground pin of the second interface, and in the case that the second interface is disconnected from the to-be-charged device, the preset reference voltage is input into the ground pin of the second interface, that is, the ground pin of the second interface is connected to a high electrical level, and the second switch unit is in the off state, so that the first switch unit is in the off state, and in a case that the connector is not connected to the to-be-charged device, the second interface is in the de-energized state, thereby reducing a probability that the pin is corroded.

In addition, a current terminal device is made thinner and thinner. A power supply VBUS pin of a USB interface is very close to an iron shell of a socket of the USB interface. Therefore, after foreign matters enter a part between the VBUS pin and the iron shell, the VBUS pin and the iron shell are grounded, causing a problem of port burn-out. In addition, due to corrosion or foreign matters between a ground GND pin and the VBUS pin, port burn-out may also be caused. Based on this, the connector in this embodiment of the present disclosure further includes:

a control unit 123, where the control unit 123 is connected to a control terminal of the second switch unit 122 and the power input terminal VBUS_IN of the second interface 12.

In a case that the second interface 12 is connected to the to-be-charged device, and the control unit 123 detects that a temperature of the second interface 12 is greater than a preset threshold, the control unit 123 controls the first switch unit 121 and the second switch unit 122 to be in the off state; and in a case that the second interface 12 is connected to the to-be-charged device, and the control unit 123 detects that the temperature of the second interface 12 is less than or equal to the preset threshold, the control unit 123 controls the first switch unit 121 and the second switch unit 122 to be in the on state.

Herein, the temperature of the second interface is detected, so that an on-off state of the first switch unit and the second switch unit is changed based on temperature changes of the second interface. In a case that the temperature of the second interface is greater than the preset threshold, the second switch unit is controlled to be in the off state, so that the first switch unit is in the off state, thereby effectively resolving a problem of port burn-out, and improving charging safety.

Optionally, the first switch unit includes a first MOSFET Q1.

A source of the first MOSFET Q1 is connected to the power input terminal of the second interface, a drain of the first MOSFET Q1 is connected to the power output terminal of the second interface, and a gate of the first MOSFET Q1 is connected to the second switch unit.

In a case that the ground pin of the second interface is disconnected from the to-be-charged device, that is, a preset reference voltage is input into the ground pin of the second interface, the second switch unit is in the off state, so that a gate-source voltage of the first MOSFET is within a preset range, and the first MOSFET is in a cut-off state.

The preset range is a cut-off voltage range of the first MOSFET, and the first MOSFET is a P-type switch transistor.

Herein, an MOSFET is connected in series in a VBUS charging loop, and the gate of the first MOSFET is connected to the ground pin A12 of the port C of the Type-C data cable, so that the gate of the first MOSFET is controlled by the second switch unit, and in a case that the data cable is not connected to the to-be-charged device, the port C of the data cable is in the de-energized state, thereby reducing a probability that the terminal is corroded.

Optionally, in the case that the second interface is connected to the to-be-charged device, and the control unit detects that the temperature of the second interface is less than or equal to the preset threshold, the second switch unit is in the on state, so that the gate-source voltage of the first MOSFET is beyond the preset range, and the first MOSFET is in a conducting state.

Herein, in a case that the second interface is connected to the to-be-charged device, and the temperature of the second interface is less than or equal to the preset threshold, the second switch unit is in the on state, so that the first MOSFET is in the conducting state, thereby effectively avoiding a problem of port burn-out on the premise of guaranteeing normal charging.

Optionally, the second switch unit includes: a second MOSFET Q2 and a third MOSFET Q3.

A gate of the second MOSFET Q2 is connected to the ground pin of the second interface, a source of the second MOSFET Q2 is connected to the gate of the first MOSFET, and a drain of the second MOSFET Q2 is connected to a drain of the third MOSFET Q3.

A source of the third MOSFET Q3 is grounded, and a gate of the third MOSFET Q3 is connected to the control unit 123.

In the case that the second interface 12 is disconnected from the to-be-charged device, the control unit 123 outputs a high electrical level, the third MOSFET Q3 is in the conducting state, and the second MOSFET Q2 is in the cut-off state, so that the first MOSFET Q1 is in the cut-off state.

In the case that the second interface 12 is connected to the to-be-charged device, and the control unit detects that the temperature of the second interface 12 is greater than the preset threshold, the control unit outputs a low electrical level, the third MOSFET Q3 is in the cut-off state, and the second MOSFET Q2 is in the conducting state, so that the first MOSFET Q1 is in the cut-off state.

In the case that the second interface 12 is connected to the to-be-charged device, and the control unit detects that the temperature of the second interface 12 is less than or equal to the preset threshold, the control unit outputs a high electrical level, the third MOSFET Q3 is in the conducting state, and the second MOSFET Q2 is in the conducting state, so that the first MOSFET Q1 is in the conducting state.

It should be noted that, that the second switch unit is in the off state in this embodiment of the present disclosure refers to that the third MOSFET Q3 is in the cut-off state, and the second MOSFET Q2 is in the conducting state; or that the third MOSFET Q3 is in the conducting state, and the second MOSFET Q2 is in the cut-off state. That the second switch unit is in the on state refers to that the third MOSFET Q3 is in the conducting state, and the second MOSFET Q2 is in the conducting state. That the first switch unit is in the off state refers to that the first MOSFET is in the cut-off state; and that the first switch unit is in the on state refers to that the first MOSFET is in the conducting state.

The second MOSFET may be specifically a P-type switch transistor, and the third MOSFET may be specifically an N-type switch transistor.

In this embodiment of the present disclosure, a high electrical level or a low electrical level is output by the control unit, to change the on-off state of the second switch unit, so as to control the on-off state of the first MOSFET.

Optionally, the connector in this embodiment of the present disclosure further includes:

a first resistor R1, where the first resistor R1 is provided between the power input terminal and the source of the second MOSFET; and a second resistor R2, where the second resistor R2 is provided between the gate of the first MOSFET and the source of the second MOSFET.

Herein, the first resistor and the second resistor play a role of voltage division, and resistance values of the first resistor and the second resistor can be determined based on a conducting voltage of the first MOSFET.

Optionally, the control unit 123 includes:

a comparator, where an output terminal of the comparator is connected to the gate of the third MOSFET;

a first group of resistors, where the first group of resistors include a thermistor R3 and a first fixed resistor R4; and a second group of resistors, where the second group of resistors include a second fixed resistor R5 and a third fixed resistor R6.

A first terminal of the first fixed resistor R4 is connected to the power input terminal, a second terminal of the first fixed resistor R4 is connected to a first terminal of the thermistor R3, and a second terminal of the thermistor R3 is grounded.

A first terminal of the second fixed resistor R5 is connected to the power input terminal, a second terminal of the second fixed resistor R5 is connected to a first terminal of the third fixed resistor R6, and a second terminal of the third fixed resistor R6 is grounded.

A first input terminal of the comparator is connected to the second terminal of the first fixed resistor, and a second input terminal of the comparator is connected to the second terminal of the second fixed resistor.

In this embodiment of the present disclosure, the comparator may be of a push-pull type, or may be of an open-drain type. However, the comparator of the latter type needs to be additionally provided with a pull-up resistor, and the comparator may be a voltage comparator.

The first input terminal may be a non-inverting input terminal of the comparator, or may be an inverting input terminal of the comparator. In a case that the first input terminal is the non-inverting input terminal of the comparator, the thermistor is a negative temperature coefficient (NTC) resistor; or in a case that the first input terminal is the inverting input terminal of the comparator, the thermistor is a positive temperature coefficient (PTC) resistor.

The non-inverting input terminal and the inverting input terminal of the comparator are composed of voltage divider resistors. In a case that a resistor of the inverting input terminal forms a reference input source via voltage division, the voltage divider resistor of the inverting input terminal is an NTC resistor, and the resistor is placed at an interface and used to detect temperature changes of the interface; or in a case that a resistor of the non-inverting input terminal forms a reference input source via voltage division, the voltage divider resistor of the non-inverting input terminal is a PTC resistor, and the resistor is placed at the interface and used to sense temperature changes of the interface in real time.

According to the connector in this embodiment of the present disclosure, a GND pin in the port C of the Type-C data cable is used as a control pin of a PMOS switch transistor (or may be a P-type triode), a power PMOSFET is connected in series to a VBUS power network of the port C of the data cable, and the voltage comparator is triggered by utilizing a characteristic of the NTC resistor (or the PTC resistor) that its resistance value changes with temperature changes, so that on/off of an NMOS switch (or may be an N-type triode switch) can be controlled, and on/off of a PMOSFET on the VBUS line can be controlled. In this way, in a case that a mobile terminal is not charged, the port of the data cable is kept in the de-energized state all the time, so that a probability that pins for charging are corroded is reduced, which can avoid a problem of port burn-out during normal use, and greatly improve charging safety.

The connector in the present disclosure is described below with reference to embodiments:

Embodiment 1: The first input terminal is the non-inverting input terminal, and the thermistor is the NTC resistor.

After a user uses a power adapter or another power supply port to charge a mobile terminal, the data cable is usually left on the power adapter or on the power supply port all the time.

(1) In a case that the first interface of the data cable is plugged into the power adapter, and the port C (the second interface) is in a suspended state, a VBUS voltage of the data cable is 5 V, the gate (or the base) of Q2 is in a stable electrical level state (some switch transistors need to be additionally connected to a pull-up resistor to control a state of the gate), and in this case, Q2 is in the cut-off state. In addition, because a gate-source voltage of Q1 is less than |Vgs1|, Q1 is in the cut-off state, where Vgs1 denotes a cut-in voltage of Q1. The two input terminals of the comparator are composed of VBUS network voltage divider resistors, where the voltage divider resistor of the non-inverting input terminal is the NTC resistor, and the voltage divider resistor of the inverting input terminal is a resistor with a fixed resistance value, so that in a normal use environment, an electrical level of the non-inverting input terminal is higher than that of the inverting input terminal, the comparator outputs a high electrical level, and therefore Q3 is conducted. A voltage divider network is directly connected to the VBUS network. As a result, certain current leakage occurs, and a current leakage amount is usually determined by R3, R4, R5, and R6.

(2) In a case that the port C of the data cable is plugged into the mobile terminal, the pin A12 corresponding to the gate (the base) of Q2 is pulled down. Therefore, a gate-source voltage of Q2 is greater than |Vgs2|, and Q2 is in the conducting state, where Vgs2 denotes a cut-in voltage of Q2.

(3) After Q2 and Q3 are conducted, the gate-source voltage of Q1 on the VBUS circuit is also greater than |Vgs1|, so that Q1 is conducted, the VBUS_OUT outputs a voltage, and the mobile terminal performs detection and starts a charging process.

(4) In a case that the mobile terminal is in a charged state, due to foreign matters between the VBUS_OUT and the GND pin, the VBUS_OUT and the GND pin are micro-short-circuited, which causes a temperature of the port to increase sharply, and a resistance value of the NTC resistor (R3) placed at the port C decreases with the temperature increase. When the temperature increases to a preset value Vth1 (Vth1 selection depends on a resistance value of the voltage divider resistor), an electrical level of the non-inverting input terminal is lower than that of the inverting input terminal, the voltage comparator outputs a low electrical level, a gate-source voltage of Q3 is less than |Vgs3|, so that Q3 is in the cut-off state, and therefore the second switch unit is in the off state, where Vgs3 denotes a cut-in voltage of Q3. In addition, an electrical level of the gate of Q1 is a VBUS voltage, and the gate-source voltage of Q1 is less than |Vgs1|, so that Q1 switches from the conducting state to the cut-off state, and the VBUS_OUT terminal stops voltage outputting. In a case that the temperature decreases, a resistance value of the NTC resistor returns to a normal value. In this case, the comparator outputs a high electrical level, and Q3 is conducted, which causes Q1 to be conducted, and the VBUS_OUT outputs a voltage again.

(5) After the mobile terminal is pulled out, the pin A12 corresponding to the gate of Q2 is in the suspended state, and Q2 is cut off. Therefore, Q1 switches from the conducting state to the cut-off state, and the entire port C of the data cable is in the de-energized state.

(6) In a case that the port C of the data cable is plugged into the mobile terminal in an early stage, the gate (the base) of Q2 is already grounded. In a case that the first interface of the data cable is plugged into the power adapter or the power supply port, Q2 is conducted, and then the voltage comparator works, so that Q1 is conducted. Subsequent processes are the same as (3) to (5).

Embodiment 2: The first input terminal is the inverting input terminal, and the thermistor is the PTC resistor.

After a user uses a power adapter or another power supply port to charge a mobile terminal, the data cable is usually left on the power adapter or on the power supply port all the time.

(1) in a case that the first interface of the data cable is plugged into the power adapter, and the port C (the second interface) is in a suspended state, a VBUS voltage of the data cable is 5 V, the gate (or the base) of Q2 is in a stable electrical level state (some switch transistors need to be additionally connected to a pull-up resistor to control a state of the gate), and in this case, Q2 is in the cut-off state. In addition, because a gate-source voltage of Q1 is less than Q1 is in the cut-off state, where Vgs1 denotes a cut-in voltage of Q1. The two input terminals of the comparator are composed of VBUS network voltage divider resistors, where the voltage divider resistor of the non-inverting input terminal is a resistor with a fixed resistance value, and the voltage divider resistor of the inverting input terminal is the PTC resistor, so that in a normal use environment, an electrical level of the non-inverting input terminal is higher than that of the inverting input terminal, the comparator outputs a high electrical level, and therefore Q3 is conducted. A voltage divider network is directly connected to the VBUS network. As a result, certain current leakage occurs, and a current leakage amount is usually determined by R3, R4, R5, and R6.

(2) In the case that the port C of the data cable is plugged into the mobile terminal, the pin A12 corresponding to the gate (the base) of Q2 is pulled down. Therefore, a gate-source voltage of Q2 is greater than |Vgs2|, and Q2 is in the conducting state, where Vgs2 denotes a cut-in voltage of Q2.

(3) After Q2 and Q3 are conducted, the gate-source voltage of Q1 on the VBUS circuit is also greater than |Vgs1|, so that Q1 is conducted, the VBUS_OUT outputs a voltage, and the mobile terminal performs detection and starts a charging process.

(4) In the case that the mobile terminal is in a charged state, due to foreign matters between the VBUS_OUT and the GND pin, the VBUS_OUT and the GND pin are micro-short-circuited, which causes a temperature of the port to increase sharply, and a resistance value of the PTC resistor placed at the port C increases with the temperature increase. When the temperature increases to a preset value Vth2 (Vth2 selection depends on a resistance value of the voltage divider resistor), an electrical level of the non-inverting input terminal is lower than that of the inverting input terminal, the voltage comparator outputs a low electrical level, a gate-source voltage of Q3 is less than |Vgs3|, so that Q3 is in the cut-off state, and therefore the second switch unit is in the off state, where Vgs3 denotes a cut-in voltage of Q3. In addition, an electrical level of the gate of Q1 is a VBUS voltage, and the gate-source voltage of Q1 is less than |Vgs1|, so that Q1 switches from the conducting state to the cut-off state, and the VBUS_OUT terminal stops voltage outputting. In the case that the temperature decreases, a resistance value of the PTC resistor returns to a normal value. In this case, the comparator outputs a high electrical level, and Q3 is conducted, which causes Q1 to be conducted, and the VBUS_OUT outputs a voltage again.

Subsequent processes are the same as (5) and (6) in Embodiment 1, and details are not described herein again.

According to the connector in this embodiment of the present disclosure, a GND pin in the port C of the Type-C data cable is used as a control pin of a PMOS switch transistor (or may be a P-type triode), a power PMOSFET is connected in series to a VBUS power network of the port C of the data cable, and the voltage comparator is triggered by utilizing a characteristic of the NTC resistor (or the PTC resistor) that its resistance value changes with temperature changes, so that on/off of an NMOS switch (or may be an N-type triode switch) can be controlled, and on/off of a PMOSFET on the VBUS line can be controlled. In this way, in a case that the mobile terminal is not charged, the port of the data cable is kept in the de-energized state all the time, so that a probability that pins for charging are corroded is reduced, which can avoid a problem of port burn-out during normal use, and greatly improve charging safety.

The embodiments in this specification are described in a progressive manner. Each embodiment focuses on a difference from another embodiment. For a same or similar part of the embodiments, refer to each other.

Although some optional embodiments in the embodiments of the present disclosure have been described, persons skilled in the art can make changes and modifications to these embodiments once they learn the basic inventive concept. Therefore, the following claims are intended to be construed as to cover optional embodiments and all changes and modifications falling within the scope of the embodiments of this disclosure.

Finally, it should be noted that in this specification, relationship terms such as "first" and "second" are merely used to distinguish one entity or operation from another, and do not necessarily require or imply that any actual relationship or sequence exists between these entities or operations. Moreover, the terms "include", "comprise", or their any other variants are intended to cover a non-exclusive inclusion, so that a process, a method, an article, or a terminal device that includes a list of elements not only includes those elements but also includes other elements that are not listed, or further includes elements inherent to such a process, method, article, or terminal device. Without being subject to further limitations, an element defined by a phrase "including one . . . " does not exclude presence of other identical elements in the process, method, article, or terminal device that includes the element.

The foregoing descriptions are merely optional embodiments of the present disclosure, but are not intended to limit the present disclosure. Any modification, equivalent replacement, or improvement made without departing from the spirit and principle of the present disclosure shall fall within the protection scope of the present disclosure.

What is claimed is:

1. A connector, wherein a first end of the connector is provided with a first interface, a second end of the connector is provided with a second interface, the first interface is connected to a charging power supply, and the second interface comprises:
   a first switch unit, wherein the first switch unit is connected in series between a power input terminal and a power output terminal of the second interface; and
   a second switch unit, wherein the second switch unit is connected to a control terminal of the first switch unit and a ground pin of the second interface, wherein
   in a case that the second interface is disconnected from a to-be-charged device, a high-level reference voltage is input into the ground pin of the second interface so that the second switch unit is in an off state, which causes the first switch unit to be in an off state; and in a case that the second interface is connected to the to-be-charged device, the ground pin of the second interface is connected to a ground pin of the to-be-charged device, the ground pin of the second interface is grounded, and the first switch unit is in an on state.

2. The connector according to claim 1, further comprising:
   a control unit, wherein the control unit is connected to a control terminal of the second switch unit and the power input terminal of the second interface, wherein
   in a case that the second interface is connected to the to-be-charged device, and the control unit detects that a temperature of the second interface is greater than a preset threshold, the control unit controls the first switch unit and the second switch unit to be in the off state; and in a case that the second interface is connected to the to-be-charged device, and the control unit detects that the temperature of the second interface is less than or equal to the preset threshold, the control unit controls the first switch unit and the second switch unit to be in the on state.

3. The connector according to claim 2, wherein the first switch unit comprises a first metal-oxide-semiconductor field-effect transistor (MOSFET);
   a source of the first MOSFET is connected to the power input terminal of the second interface, a drain of the first MOSFET is connected to the power output terminal of the second interface, and a gate of the first MOSFET is connected to the second switch unit; and
   in the case that the second interface is disconnected from the to-be-charged device, the second switch unit is in the off state, and the first MOSFET is in a cut-off state.

4. The connector according to claim 3, wherein in the case that the second interface is connected to the to-be-charged device, and the control unit detects that the temperature of the second interface is less than or equal to the preset threshold, the second switch unit is in the on state, and the first MOSFET is in a conducting state.

5. The connector according to claim 3, wherein the second switch unit comprises:
   a second MOSFET and a third MOSFET, wherein
   a gate of the second MOSFET is connected to the ground pin of the second interface, a source of the second MOSFET is connected to the gate of the first MOSFET, and a drain of the second MOSFET is connected to a drain of the third MOSFET; and
   a source of the third MOSFET is grounded, and a gate of the third MOSFET is connected to the control unit.

6. The connector according to claim 5, further comprising:
   a first resistor, wherein the first resistor is provided between the power input terminal and the source of the second MOSFET; and
   a second resistor, wherein the second resistor is provided between the gate of the first MOSFET and the source of the second MOSFET.

7. The connector according to claim 5, wherein the second MOSFET is a P-type switch transistor, and the third MOSFET is an N-type switch transistor.

8. The connector according to claim 5, wherein the control unit comprises:
   a comparator, where an output terminal of the comparator is connected to the gate of the third MOSFET;
   a first group of resistors, wherein the first group of resistors comprise a thermistor and a first fixed resistor; and
   a second group of resistors, wherein the second group of resistors comprise a second fixed resistor and a third fixed resistor, wherein
   a first terminal of the first fixed resistor is connected to the power input terminal, a second terminal of the first fixed resistor is connected to a first terminal of the thermistor, and a second terminal of the thermistor is grounded;
   a first terminal of the second fixed resistor is connected to the power input terminal, a second terminal of the second fixed resistor is connected to a first terminal of the third fixed resistor, and a second terminal of the third fixed resistor is grounded; and
   a first input terminal of the comparator is connected to the second terminal of the first fixed resistor, and a second input terminal of the comparator is connected to the second terminal of the second fixed resistor.

9. The connector according to claim 6, wherein the control unit comprises:
   a comparator, where an output terminal of the comparator is connected to the gate of the third MOSFET;
   a first group of resistors, wherein the first group of resistors comprise a thermistor and a first fixed resistor; and
   a second group of resistors, wherein the second group of resistors comprise a second fixed resistor and a third fixed resistor, wherein
   a first terminal of the first fixed resistor is connected to the power input terminal, a second terminal of the first fixed resistor is connected to a first terminal of the thermistor, and a second terminal of the thermistor is grounded;
   a first terminal of the second fixed resistor is connected to the power input terminal, a second terminal of the second fixed resistor is connected to a first terminal of the third fixed resistor, and a second terminal of the third fixed resistor is grounded; and
   a first input terminal of the comparator is connected to the second terminal of the first fixed resistor, and a second input terminal of the comparator is connected to the second terminal of the second fixed resistor.

10. The connector according to claim 8, wherein in a case that the first input terminal is a non-inverting input terminal of the comparator, the thermistor is a negative temperature coefficient (NTC) resistor; or
   in a case that the first input terminal is an inverting input terminal of the comparator, the thermistor is a positive temperature coefficient (PTC) resistor.

11. The connector according to claim 9, wherein in a case that the first input terminal is a non-inverting input terminal of the comparator, the thermistor is a negative temperature coefficient (NTC) resistor; or in a case that the first input terminal is an inverting input terminal of the comparator, the thermistor is a positive temperature coefficient (PTC) resistor.

12. The connector according to claim 3, wherein the first MOSFET is a P-type switch transistor.

* * * * *